United States Patent
Ide et al.

(10) Patent No.: US 11,903,198 B2
(45) Date of Patent: Feb. 13, 2024

(54) SEMICONDUCTOR DEVICE AND MANUFACTURING METHOD THEREOF

(71) Applicant: Kioxia Corporation, Tokyo (JP)

(72) Inventors: Kenichi Ide, Kuwana (JP); Hiroko Tahara, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 323 days.

(21) Appl. No.: 17/350,513

(22) Filed: Jun. 17, 2021

(65) Prior Publication Data

US 2022/0077185 A1  Mar. 10, 2022

(30) Foreign Application Priority Data

Sep. 9, 2020 (JP) ................... 2020-151432

(51) Int. Cl.
  *H10B 43/27* (2023.01)
  *H01L 23/522* (2006.01)
  *H01L 21/768* (2006.01)
  *H01L 23/532* (2006.01)

(52) U.S. Cl.
  CPC ....... *H10B 43/27* (2023.02); *H01L 21/76802* (2013.01); *H01L 21/76843* (2013.01); *H01L 21/76877* (2013.01); *H01L 23/5226* (2013.01); *H01L 23/53266* (2013.01)

(58) Field of Classification Search
  CPC ........ H10B 43/27; H10B 43/35; H10B 43/50; H01L 21/76802; H01L 21/76843; H01L 21/76877; H01L 23/5226; H01L 23/53266; H01L 29/40117; H01L 21/76838; H01L 23/53261
  See application file for complete search history.

(56) References Cited

U.S. PATENT DOCUMENTS

| | | |
|---|---|---|
| 9,748,174 B1 * | 8/2017 | Amano ............ H01L 29/40117 |
| 9,978,685 B2 | 5/2018 | Chen et al. |
| 2015/0364485 A1 | 12/2015 | Shimura et al. |
| 2017/0125538 A1 | 5/2017 | Sharangpani et al. |
| 2018/0247821 A1 | 8/2018 | Chen et al. |
| 2019/0279932 A1 | 9/2019 | Wakatsuki et al. |
| 2020/0058676 A1 | 2/2020 | Ono et al. |
| 2020/0075624 A1 | 3/2020 | Kasashima et al. |
| 2020/0075625 A1 | 3/2020 | Kobayashi et al. |
| 2020/0083239 A1 | 3/2020 | Komiya et al. |

FOREIGN PATENT DOCUMENTS

CN       111180320 A       5/2020

* cited by examiner

*Primary Examiner* — Karen Kusumakar
(74) *Attorney, Agent, or Firm* — Oblon, McClelland, Maier & Neustadt, L.L.P.

(57) ABSTRACT

A semiconductor device according to an embodiment includes a stacked body including a plurality of conductive layers and a plurality of first insulation layers alternately stacked in a first direction. The conductive layers each include a first metal layer and a second metal layer. The first metal layer contains a first metal element and a substance that is chemically reactive with a material gas containing the first metal element. The second metal layer contains the first metal element and has a lower content of the substance than the first metal layer. The first metal layer is disposed between the first insulation layers and the second metal layer.

11 Claims, 14 Drawing Sheets

SEMICONDUCTOR DEVICE AND MANUFACTURING METHOD THEREOF

CROSS REFERENCE TO RELATED APPLICATIONS

This application is based upon and claims the benefit of priority from the prior Japanese Patent Application No. 2020-151432, filed on Sep. 9, 2020, the entire contents of which are incorporated herein by reference.

FIELD

The embodiments of the present invention relate to a semiconductor device and a manufacturing method thereof.

BACKGROUND

Some semiconductor devices (semiconductor storages) such as a NAND EEPROM (Electrically Erasable Programmable Read-only Memory) include a solid memory cell array including three-dimensionally arranged memory cells. Such a memory cell array includes a stacked body in which conductive layers that function as word lines and insulation layers are alternately stacked on each other.

However, a reduction in height of the conductive layers resulting from miniaturization causes an increase in wiring resistance of the word lines. Further, with a barrier film thinned or omitted to reduce the wiring resistance, for example, reliability such as leakage characteristics is degraded.

DETAILED DESCRIPTION

Figure 1:
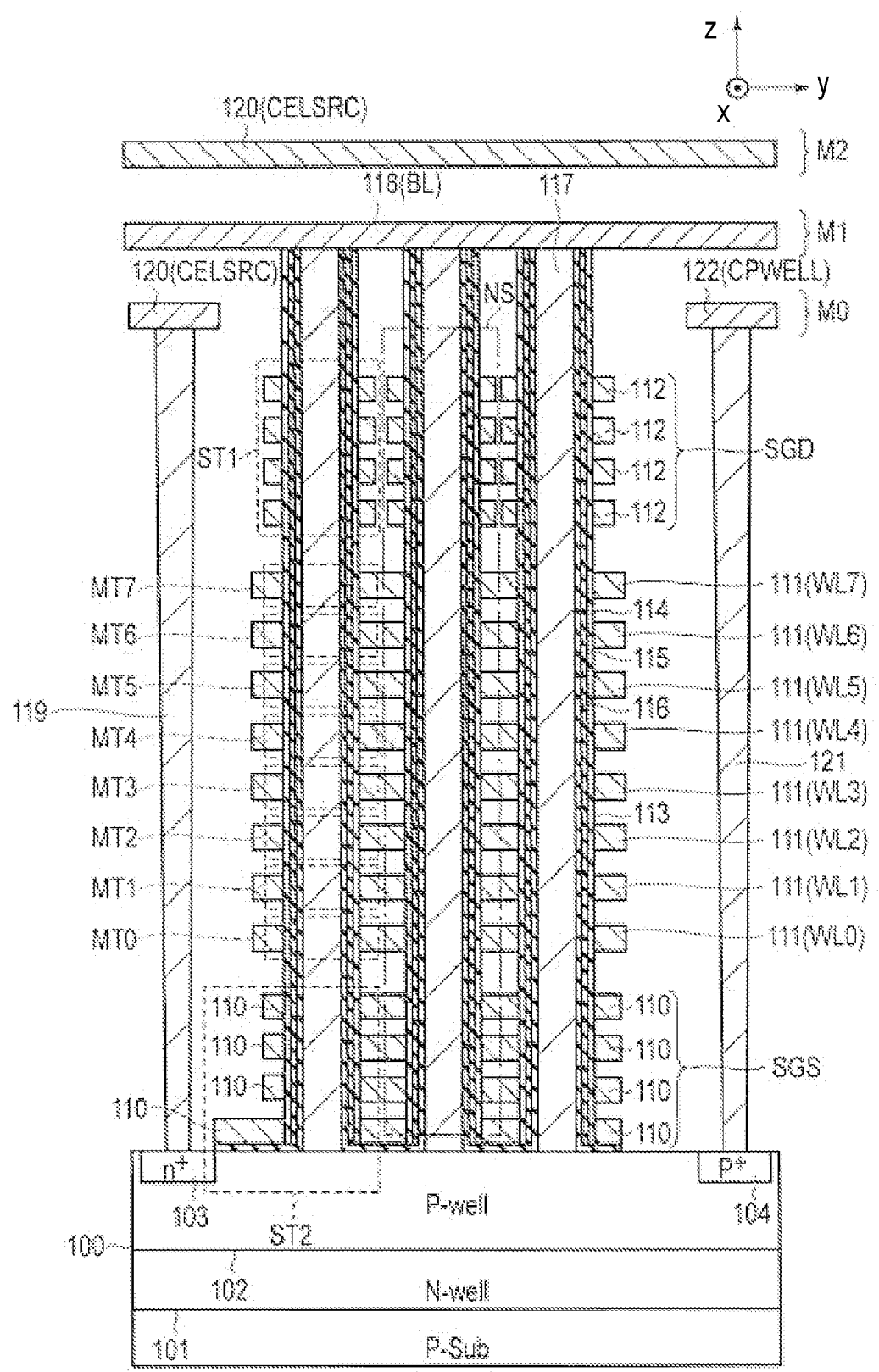
FIG. 1 shows an example of a configuration of a memory cell array of a semiconductor device according to a first embodiment.

Embodiments will now be explained with reference to the accompanying drawings. The present invention is not limited to the embodiments. In the embodiments, "an upper direction" or "a lower direction" refers to a relative direction when a direction perpendicular to a surface of a semiconductor substrate on which semiconductor elements are provided is assumed as "an upper direction". Therefore, the term "upper direction" or "lower direction" occasionally differs from an upper direction or a lower direction based on a gravitational acceleration direction. In the present specification and the drawings, elements identical to those described in the foregoing drawings are denoted by like reference characters and detailed explanations thereof are omitted as appropriate.

A semiconductor device according to an embodiment includes a stacked body including a plurality of conductive layers and a plurality of first insulation layers that are alternately stacked in a first direction. The conductive layers each include a first metal layer and a second metal layer. The first metal layer contains a first metal element and a substance that is reactive with a material gas containing the first metal element. The second metal layer contains the first metal element and has a lower content of the substance than the first metal layer. The first metal layer is disposed between the first insulation layers and the second metal layer.

First Embodiment

FIG. 1 shows an example of a configuration of a memory cell array in a semiconductor storage according to a first embodiment. A memory cell array MCA is, for example, a solid memory cell array including a three-dimensionally arranged memory cells. It should be noted that any insulation portion other than an insulation film formed in a memory hole 113 is not shown in FIG. 1 for visibility of the figure. Further, silicon is described as an example of a semiconductor in the embodiment below; however, any semiconductor may be used instead of silicon.

Further, an XYZ orthogonal coordinate system is introduced herein for convenience of explanation. In this coordinate system, two directions that are parallel with a principal surface of a substrate 100 and orthogonal to each other are referred to as an X direction and a Y direction and a direction orthogonal to both the X direction and the Y direction is referred to as a Z direction. A plurality of word lines (conductive layers) WL are stacked in the Z direction.

As shown in FIG. 1, an n-well region 101 is formed in the semiconductor substrate 100 and a p-well region 102 is formed on the n-well region 101. A plurality of NAND strings NS are formed on the p-well region 102. Specifically, a plurality of wiring layers 110 that function as a select gate line SGS, a plurality of wiring layers 111 that function as word lines WL, and a plurality of wiring layers 112 that function as a select gate line SGD are formed on the p-well region 102.

The wiring layers 110, which are formed in, for example, four tiers, are electrically connected to the select gate line SGS common to the plurality of NAND strings NS and function as a gate electrode for two selection transistors ST2.

The wiring layers 111, which are formed in, for example, eight tiers, are electrically connected to the word lines WL common on a tier basis.

The wiring layers 112, which are formed in, for example, four tiers, are connected to the select gate line SGD corresponding to each of the NAND strings NS and each function as a gate electrode for one selection transistor ST1.

The memory hole 113 is formed such that it penetrates through the wiring layers 110, 111, and 112 to the p-well region 102. A block insulation film 114, a charge storage layer 115 (insulation film), and a gate insulation film 116 are formed in sequence on a lateral surface of the memory hole 113. The memory hole 113 is filled with a conductive film 117. The conductive film 117 functions as a current path for the NAND strings NS. A wiring layer 118 that functions as a bit line BL is formed on an upper end of the conductive film 117. It should be noted that the memory hole 113 will be described later in detail with reference to FIG. 2A and FIG. 2B.

As is understood from the above, the selection transistor ST2, a plurality of memory cell transistors MT, and the selection transistor ST1 are stacked in sequence on the p-well region 102 and the one memory hole 113 corresponds to one of the NAND strings NS.

An n-plus impurity diffused layer 103 and a p-plus impurity diffused layer 104 are formed below a surface of the p-well region 102.

A contact plug 119 is formed on the n-plus impurity diffused layer 103. A wiring layer 120 that functions as a source line CELSRC is formed on the contact plug 119. Another source line CELSRC is also formed in an M2 layer. The source line CELSRC in the M2 layer is electrically connected to a voltage generation circuit.

A contact plug 121 is formed on the p-plus impurity diffused layer 104. A wiring layer 122 that functions as a well wiring CPWELL is formed on the contact plug 121.

An M0 layer, in which the wiring layers 120 and 122 are formed, is formed above the wiring layers 112 (the select gate line SGD) and below an M1 layer, in which the wiring layer 118 is formed.

A plurality of such arrangements are arranged in a depth direction with respect to the plane of paper of FIG. 1. One finger includes a group of the plurality of NAND strings NS aligned in the depth direction.

Further, the wiring layers 110, which function within the same block as the common select gate line SGS, are electrically connected to each other. The gate insulation film 116 is formed between the wiring layers 110 in the lowermost tier and the p-well region 102. One of the wiring layers 110 in the lowermost tier adjacent to the n-plus impurity diffused layer 103 and the gate insulation film 116 are formed to reach a vicinity of the n-plus impurity diffused layer 103.

This causes a channel formed in response to the selection transistor ST2 being turned on to electrically connect a memory cell transistor MT0 and the n-plus impurity diffused layer 103 to each other. The voltage generation circuit applies voltage to the well wiring CPWELL, thereby being able to apply an electric potential to the conductive film 117.

Figure 2A:
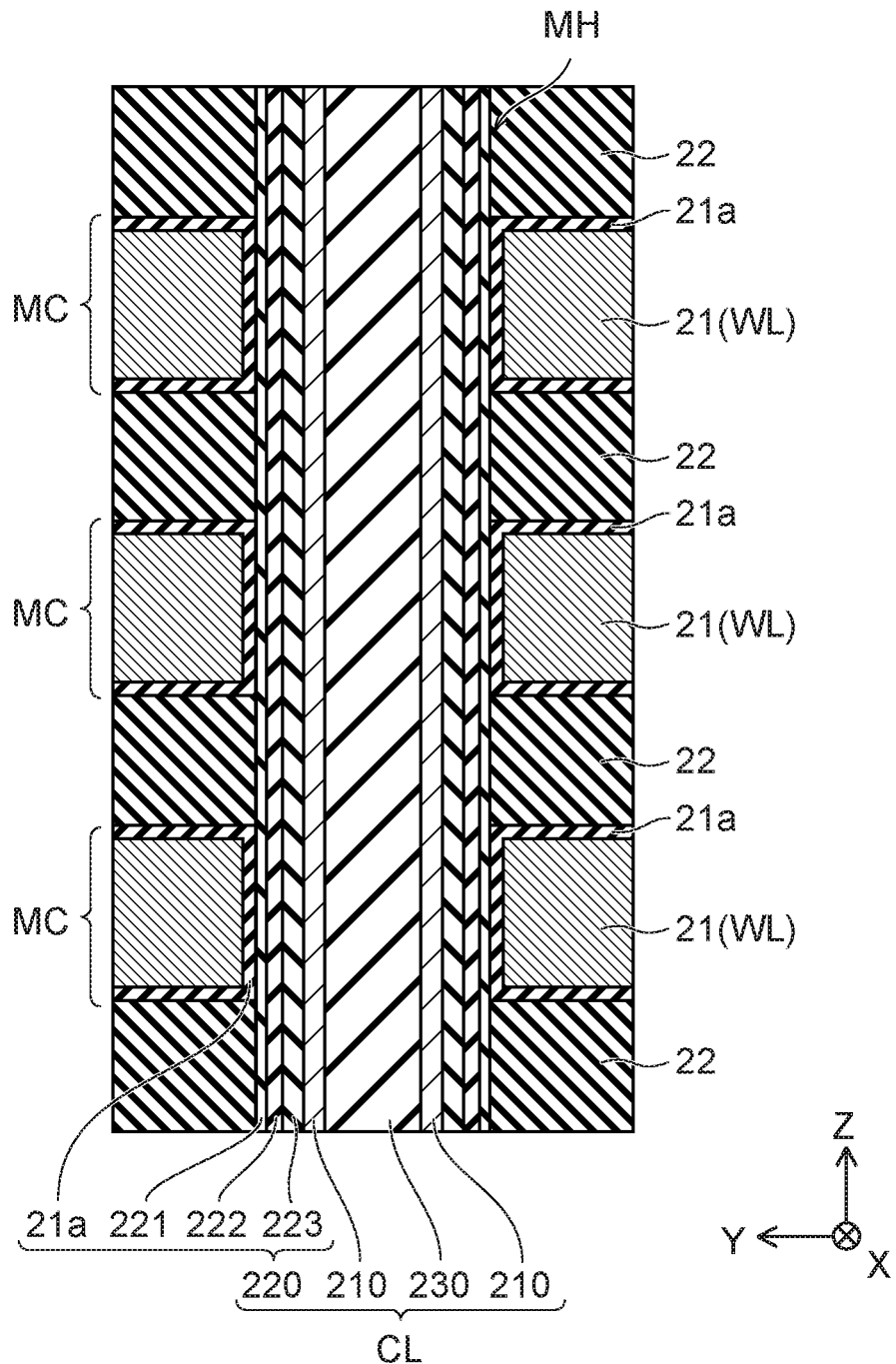
FIG. 2A is a schematic cross sectional view showing, by way of an example, memory cells in a three-dimensional structure.
Figure 2B:
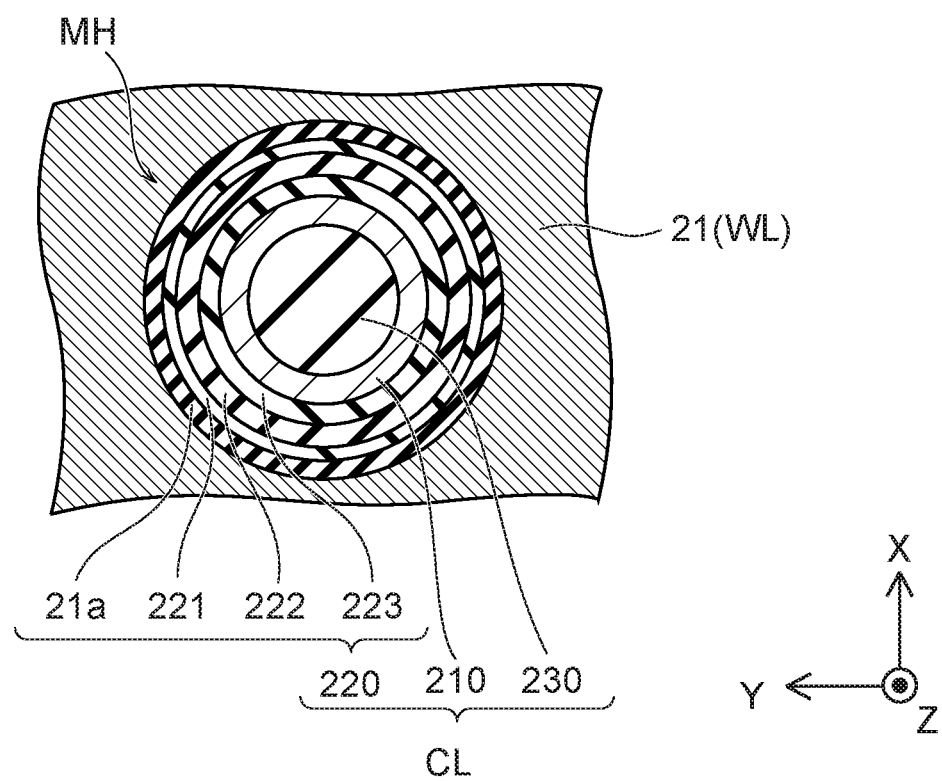
FIG. 2B is a schematic cross sectional view showing, by way of an example, the memory cells in the three-dimensional structure.

FIG. 2A and FIG. 2B are each a schematic cross sectional view showing, by way of an example, memory cells in a three-dimensional structure. A plurality of pillars CL are provided inside the memory hole 113 (hereinafter referred to as memory hole MH). The plurality of pillars CL each include a semiconductor body 210, a memory film 220, and a core layer 230.

As shown in FIG. 2A and FIG. 2B, the memory hole MH is, for example, in a circular or oval shape in an X-Y plane. A block insulation film 21a that constitutes a part of the memory film 220 may be provided between a conductive layer 21 and an insulation layer 22. The block insulation film 21a is, for example, a silicon oxide film or a metal oxide film. An example of the metal oxide is an aluminum oxide. The block insulation film 21a reduces back tunneling of charges from the conductive layer 21 toward the memory film 220.

The semiconductor body 210 is, for example, in the shape of a bottomed cylinder. The semiconductor body 210 contains, for example, silicon. The silicon is, for example, polysilicon produced by crystalizing amorphous silicon. The semiconductor body 210 is, for example, undoped silicon. Alternatively, the semiconductor body 210 may be p-type silicon. The semiconductor body 210 serves as a channel for each of a drain-side selection transistor STD, a memory cell MC, and a source-side selection transistor STS.

The memory film 220 is provided between an inner wall of the memory hole MH and the semiconductor body 210. The memory film 220 is, for example, in a cylindrical shape. A plurality of memory cells MC, each of which has a storage region between the semiconductor body 210 and the conductive layer 21 serving as the word line WL, are stacked in a Z-axis direction. The memory film 220 includes, for example, a cover insulation film 221, a charge trap film 222, and a tunnel insulation film 223. The semiconductor body 210, the charge trap film 222, and the tunnel insulation film 223 each extend in the Z-axis direction.

The cover insulation film 221 is provided between the conductive layer 21 and the insulation layer 22 and the charge trap film 222. The cover insulation film 221 contains, for example, a silicon oxide. The cover insulation film 221 protects the charge trap film 222 from being etched during replacement of a sacrificial film (not shown) with the conductive layer 21 (a replacement process). The cover insulation film 221 may be removed from between the conductive layer 21 and the memory film 220 during the replacement process. In this case, for example, the block insulation film 21a is provided between the conductive layer 21 and the charge trap film 222. Alternatively, in a case where the replacement process is not used for formation of the conductive layer 21, the cover insulation film 221 is not necessarily provided.

The charge trap film 222 is provided between the cover insulation film 221 and the tunnel insulation film 223. The charge trap film 222, which contains, for example, a silicon nitride, has a trap site for trapping charges in the film. Among the charge trap film 222, a portion sandwiched between the conductive layer 21 serving as the word line WL and the semiconductor body 210 provides, as a charge trapper, a storage region of the memory cell MC. A threshold voltage of the memory cell MC varies with whether or not any charge is trapped in the charge trapper or an amount of charges trapped in the charge trapper. This enables the memory cell MC to hold information.

The tunnel insulation film 223 is provided between the semiconductor body 210 and the charge trap film 222. The tunnel insulation film 223 contains, for example, a silicon oxide or contains a silicon oxide and a silicon nitride. The tunnel insulation film 223 provides a potential barrier between the semiconductor body 210 and the charge trap film 222. For example, during injection of electrons from the semiconductor body 210 into the charge trapper (a writing operation) and during injection of holes from the semiconductor body 210 into the charge trapper (a deletion operation), the electrons and holes pass (tunnel) through the potential barrier provided by the tunnel insulation film 223.

An inner space of the cylindrical semiconductor body 210 is filled with the core layer 230. The core layer 230 is, for example, in a columnar shape. The core layer 230, which contains, for example, a silicon oxide, is insulative.

Figure 3:
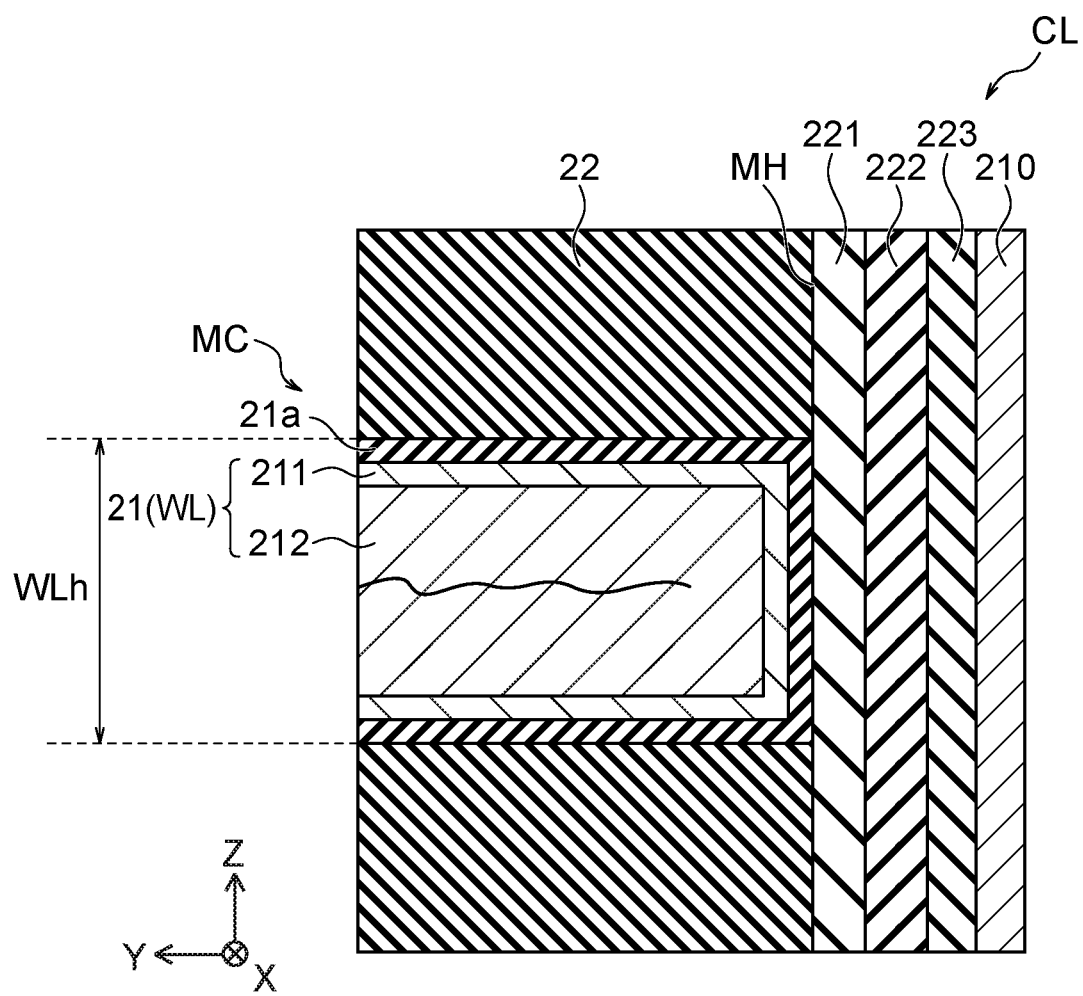
FIG. 3 is a cross sectional view showing a configuration of the semiconductor device according to the first embodiment.

FIG. 3 is a cross sectional view showing a configuration of the semiconductor device according to the first embodiment. It should be noted that FIG. 3 is also an enlarged view of the memory cell MC and a vicinity thereof.

The semiconductor device includes the stacked body including the plurality of conductive layers 21 and the plurality of insulation layers 22 that are alternately stacked in the Z direction on the semiconductor substrate 100 as described with reference to FIG. 1 and FIG. 2A. In addition, the semiconductor device further includes an insulation layer (the block insulation film 21a) provided between each of the conductive layers 21 and the insulation layers 22.

The conductive layers 21 each include a metal layer 211 and a metal layer 212 as shown in FIG. 3.

The metal layer 211 contains a first metal element and a substance that is chemically reactive with a material gas containing the first metal element. A main component of the metal layer 211 is the first metal element. The first metal element is, for example, tungsten (W). The material gas is, for example, a tungsten hexafluoride ($WF_6$) gas. The substance that is reactive with the material gas is, for example, silicon (Si). Further, the substance that is reactive with the material gas is vaporized by reaction. That is, tungsten hexafluoride is reduced with silicon, thus forming a tungsten film, namely, the metal layer 211. Meanwhile, silicon reacts with fluorine in tungsten hexafluoride by oxidation, being vaporized as $SiF_x$. It should be noted that $SiF_x$ is not always fully vaporized. $SiF_x$ thus partially remains in the metal layer 211. This makes a concentration of silicon in the metal layer 211 higher than a concentration of silicon in the metal layer 212.

The metal layer 211 functions as an underlayer or a nucleation layer for the metal layer 212, which is different in formation method. The metal layer 211 has a higher coatability on a step or the like than the metal layer 212. Thus, by virtue of providing the metal layer 211, the conductive layer 21 can be more favorably formed on the block insulation film 21a.

The metal layer 212 is provided with the metal layer 211 disposed between the metal layer 212 and the insulation layers 22. Consequently, there are five layers, i.e., the block insulation film 21a, the metal layer 211, the metal layer 212, the metal layer 211, and the block insulation film 21a, disposed in sequence in the Z direction from the lower insulation layer 22 to the upper insulation layer 22 as shown in FIG. 3.

Further, the metal layer 212 contains the first metal element and has a lower content of the substance that is chemically reactive with the material gas than the metal layer 211. This is because the metal layer 212, unlike the metal layer 211, requires no use of silicon for formation as described later. In addition, the metal layer 212 is lower in electrical resistance than the metal layer 211.

In addition, the semiconductor device further includes a column (the pillar CL) penetrating the stacked body in the Z direction as described with reference to FIG. 2A and FIG. 2B. The pillar CL includes the charge trap film 222 serving as a charge storage layer and the semiconductor body 210 serving as a semiconductor layer.

The metal layer 211 is disposed between the metal layer 212 and the charge trap film 222, or between the metal layer 212 and the semiconductor body 210. Consequently, there are three layers, i.e., the block insulation film 21a, the metal layer 211, and the metal layer 212, disposed in sequence in the Y direction from the cover insulation film 221 as shown in FIG. 3.

Next, description will be made on a method of manufacturing the semiconductor device.

FIG. 4 to FIG. 8 are each a cross sectional view showing a method of manufacturing the semiconductor device according to the first embodiment.

Figure 4:
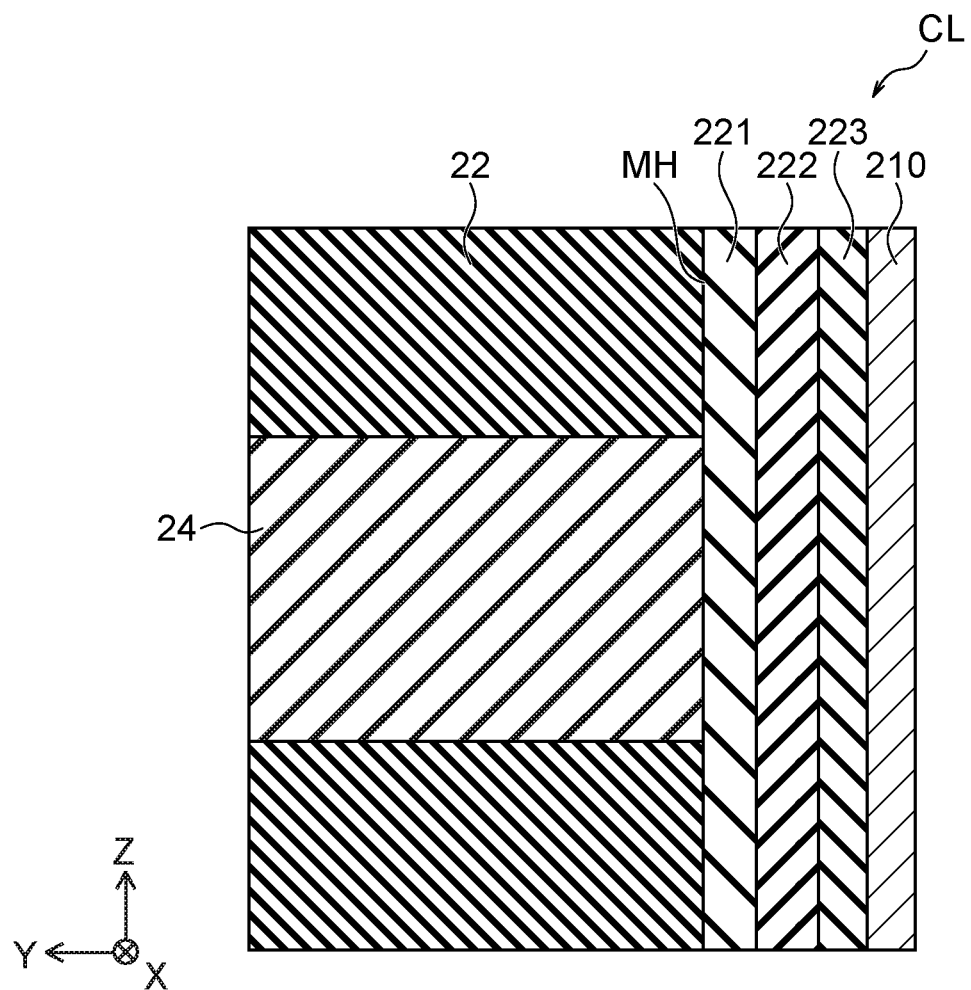
FIG. 4 is a cross sectional view showing a method of manufacturing the semiconductor device according to the first embodiment.

First, a stacked body including a plurality of sacrificial layers 24 and the plurality of insulation layers 22 that are alternately stacked in the Z direction is formed as shown in FIG. 4. In addition, in an example shown in FIG. 4, the memory hole MH is formed in the stacked body and the pillar CL is formed inside the memory hole MH.

Figure 5:
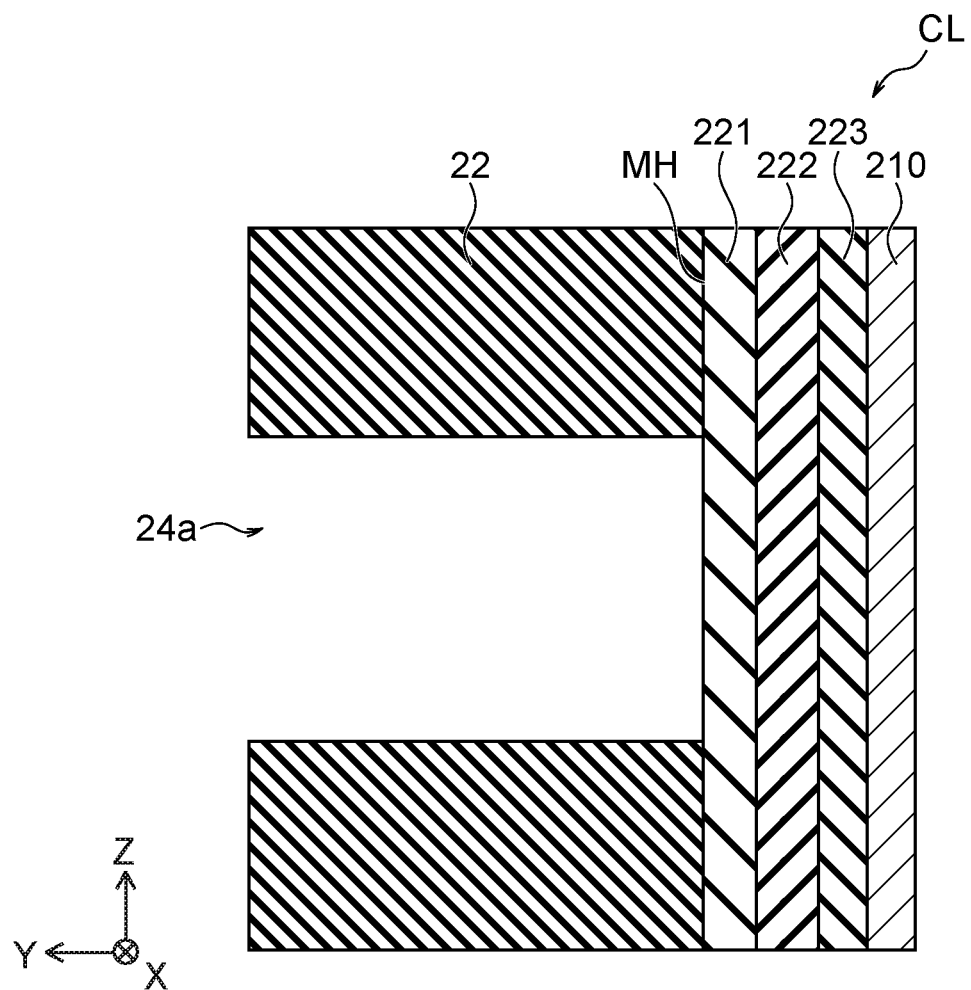
FIG. 5 is a cross sectional view subsequent to FIG. 4, showing the method of manufacturing the semiconductor device.

Subsequently, the sacrificial layers 24 are removed from the stacked body as shown in FIG. 5. The sacrificial layers 24 are, for example, silicon nitride films. In this case, the sacrificial layers 24 can be selectively removed using an etchant containing phosphate. A void 24a is thus formed between the insulation layers 22. In addition, the cover insulation film 221 is exposed through the void 24a.

Figure 6:
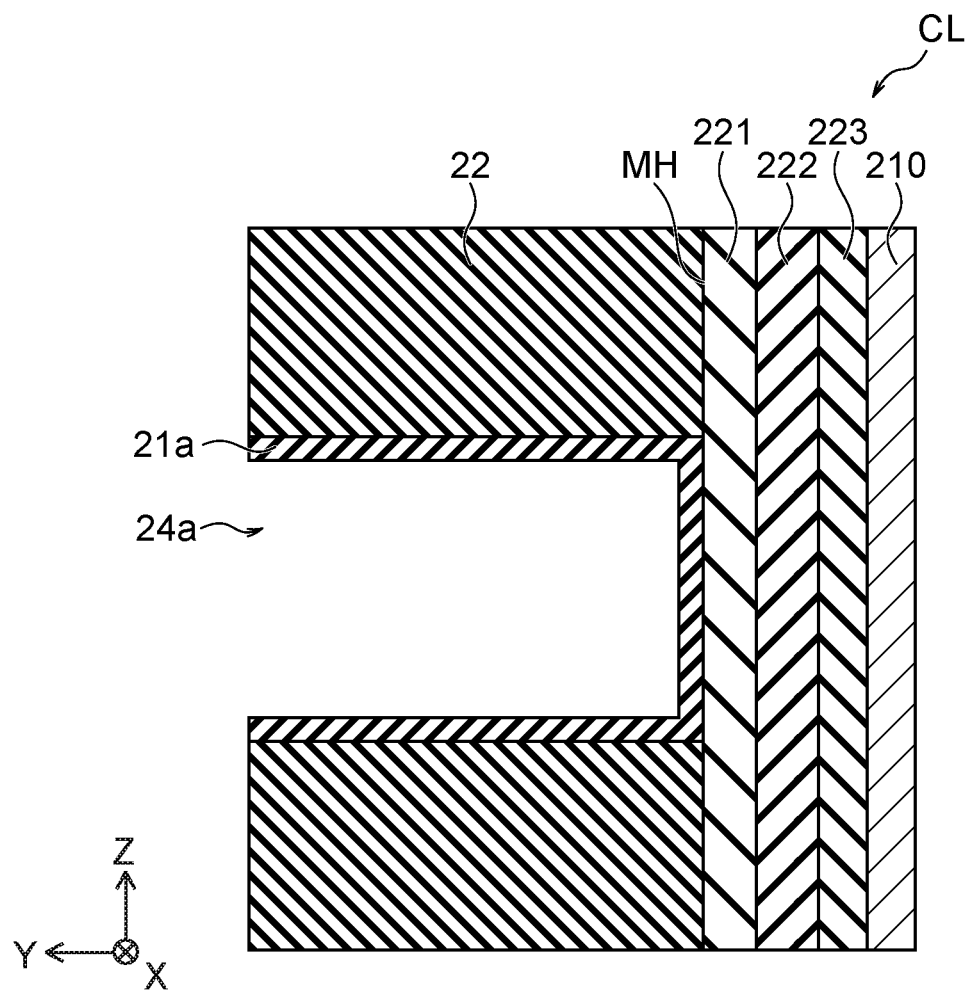
FIG. 6 is a cross sectional view subsequent to FIG. 5, showing the method of manufacturing the semiconductor device.

Subsequently, the block insulation film 21a is formed at a part of each of regions (the void 24a) from which the sacrificial layers 24 are removed as shown in FIG. 6. That is, the block insulation film 21a is formed on the insulation layers 22 and on the cover insulation film 221.

Figure 7:
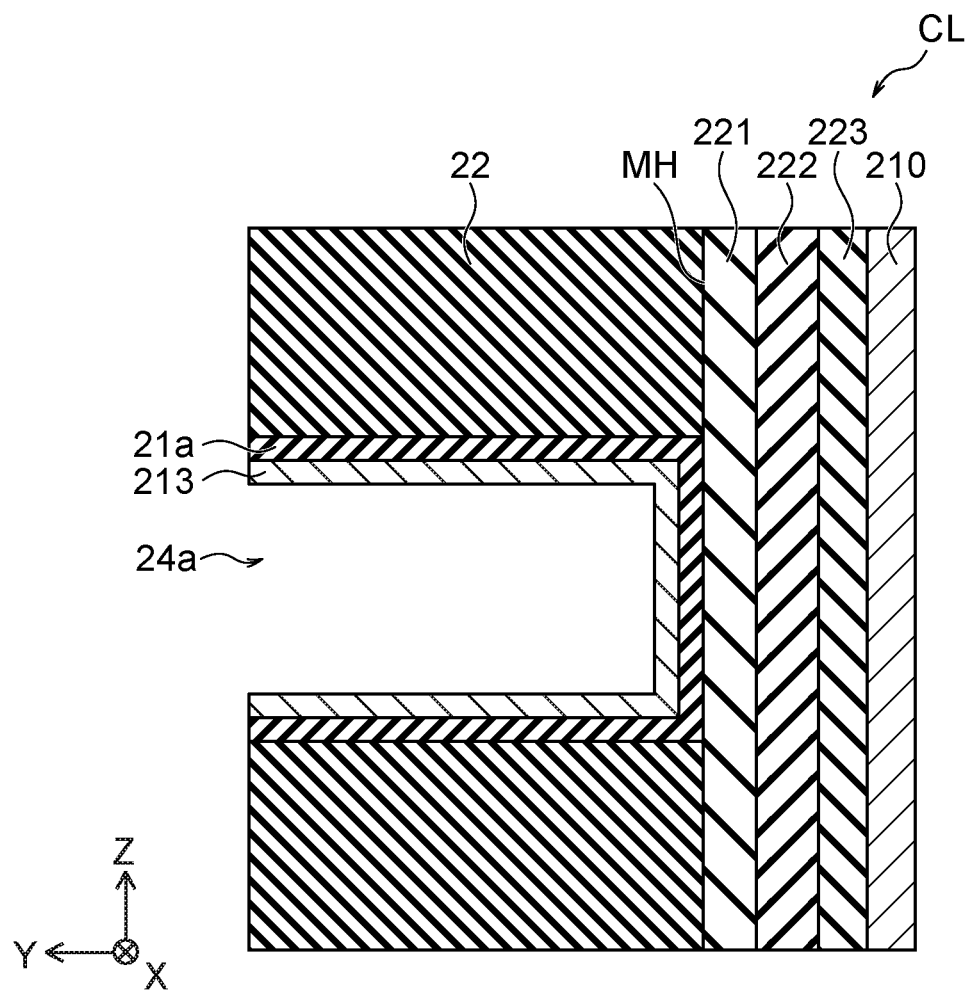
FIG. 7 is a cross sectional view subsequent to FIG. 6, showing the method of manufacturing the semiconductor device.

Subsequently, a reactive layer 213 is formed at the part of each of the regions from which the sacrificial layers 24 are removed as shown in FIG. 7. That it, the reactive layer 213 is formed on the block insulation film 21a. The reactive layer 213 contains, as a main component, a substance that is chemically reactive with the material gas containing the first metal element. The reactive layer 213 is, for example, a silicon layer. The reactive layer 213 is formed by, for example, a CVD (Chemical Vapor Deposition) method using a gas containing silicon such as Monosilane ($SiH_4$) or Disilane ($Si_2H_6$).

Figure 8:
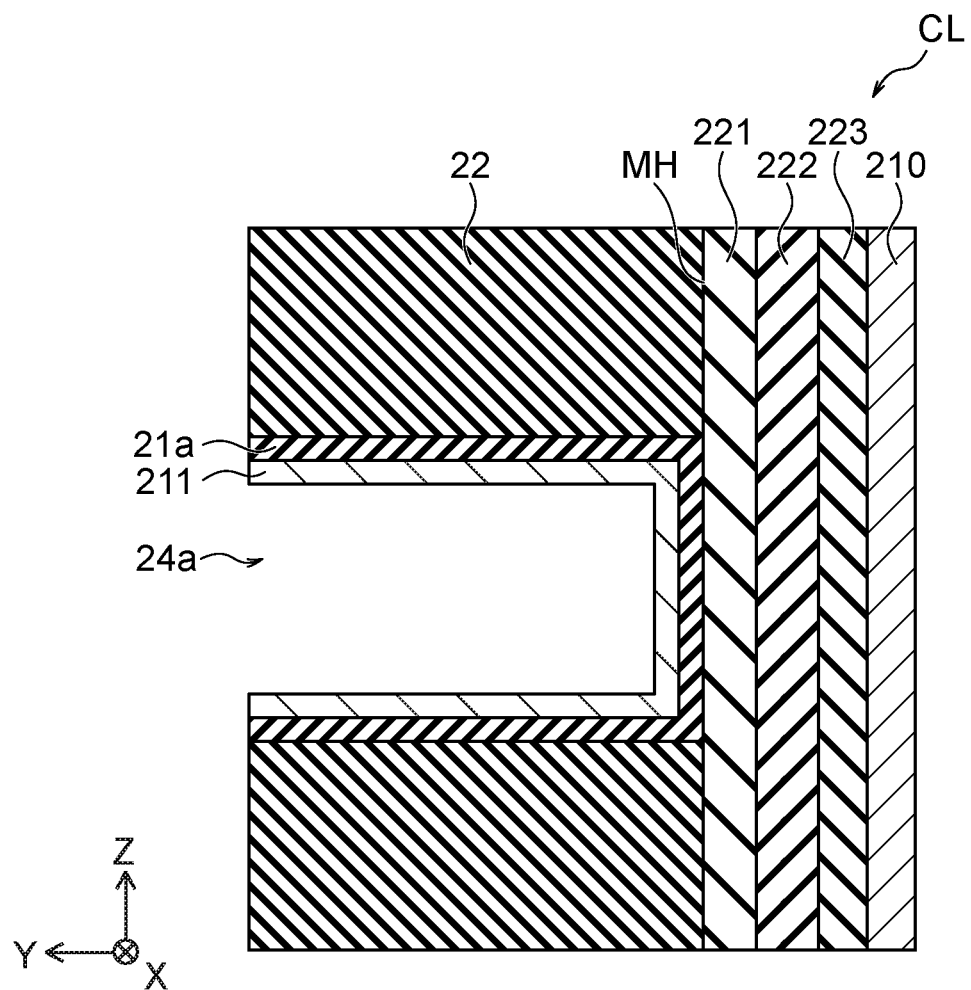
FIG. 8 is a cross sectional view subsequent to FIG. 7, showing the method of manufacturing the semiconductor device.

Subsequently, the material gas is delivered to each of the regions from which the sacrificial layers 24 are removed as shown in FIG. 8. A chemical reaction of the reactive layer with the material gas is caused, thereby forming the metal layer 211 containing the first metal element and the substance that is chemically reactive with the material gas. It should be noted that a formation process of the metal layer 211 will be described later in detail with reference to FIG. 9A to FIG. 9C.

After the process in FIG. 8, the metal layer 212 is formed on the metal layer 211 such that each of the regions from which the sacrificial layers 24 are removed is filled. The metal layer 212 contains the first metal element and has a lower content of the substance that is chemically reactive with the material gas than the metal layer 211. For example, the metal layer 212 is formed using a hydrogen ($H_2$) gas and a tungsten hexafluoride gas. The semiconductor device shown in FIG. 3 is completed in this manner.

Next, a detailed description will be made on the formation process of the metal layer 211 in the process in FIG. 8.

Figure 9A:
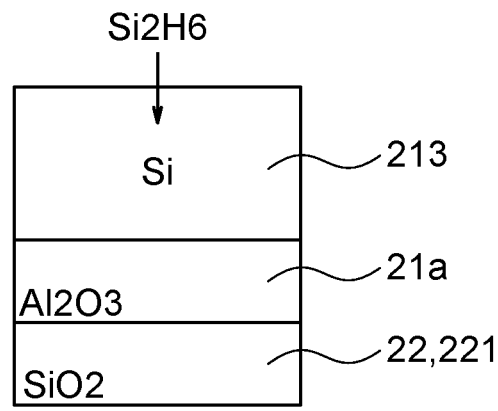
FIG. 9A schematically shows a formation process of a metal layer in a process in FIG. 8.
Figure 9B:
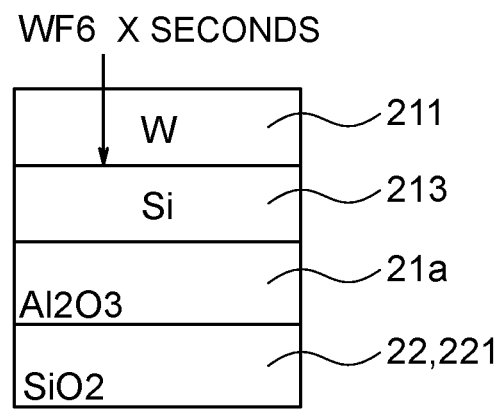
FIG. 9B schematically shows the formation process of the metal layer in the process in FIG. 8.
Figure 9C:
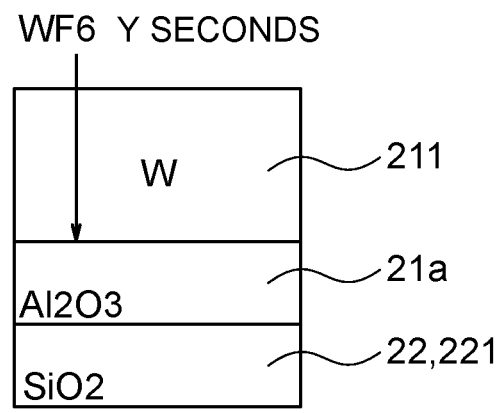
FIG. 9C schematically shows the formation process of the metal layer in the process in FIG. 8.

FIG. 9A to FIG. 9B each schematically show the formation process of the metal layer 211 in the process in FIG. 8. Time elapses from FIG. 9A to FIG. 9C. FIG. 9A shows a state in FIG. 7. FIG. 9C shows a state in FIG. 8. FIG. 9B shows a process between FIG. 7 and FIG. 8. The block insulation film 21a (for example, an aluminum oxide film) is provided on the insulation layers 22 (for example, silicon oxide films) in the Z direction in FIG. 8. Meanwhile, the block insulation film 21a is formed on the cover insulation film 221 (for example, a silicon oxide film) in the Y direction in FIG. 8.

FIG. 9A shows a point of time when the reactive layer 213 is formed by delivering disilane. A thickness of the reactive layer 213 is, for example, in a range from 1 nm, approximately, to 5 nm, approximately.

FIG. 9B shows a point of time when the tungsten hexafluoride gas is delivered for X seconds, which is shorter than Y seconds. A silicon reduction reaction progresses from the reactive layer 213 on a surface side toward the block insulation film 21a, forming the metal layer 211.

FIG. 9C shows a point of time when Y seconds elapse after the start of delivery of the tungsten hexafluoride gas. As shown in FIG. 9C, substantially all the reactive layer 213 reacts and the metal layer 211 is formed. It should be noted that a thickness of the metal layer 211 (a tungsten layer) is not changed even if the tungsten hexafluoride gas is delivered for Y seconds or more. Accordingly, the delivery of the tungsten hexafluoride gas is stopped at a timing when substantially all the reactive layer 213 finishes reacting, thereby making it possible to reduce an influence of redundancy of the tungsten hexafluoride gas. The redundancy of tungsten hexafluoride is likely to have an adverse influence, such as degradation of leakage characteristics, on the block insulation film 21a, the insulation layers 22, or the cover insulation film 221. This is because, for example, diffusion of fluorine ions in the oxide film due to heat causes a defect.

That is, the metal layer 211 is formed by delivering the material gas to each of the regions from which the sacrificial layers 24 are removed for a duration of time corresponding to the thickness of the reactive layer 213 and causing a chemical reaction of the reactive layer 213 with the material gas. For example, the timing when substantially all the reactive layer 213 finishes reacting (Y seconds in FIG. 9) can be determined by examining a relationship between a gas delivery time and the thickness of the metal layer 211 in advance with reaction conditions, such as temperature and gas concentration, fixed. For example, the gas delivery time may be halved for half the thickness of the reactive layer 213. A reaction amount can thus be adjusted by adjusting the gas delivery time. This allows less fluorine to enter the block insulation film 21a and the insulation layers 22, allowing for reducing degradation of reliability such as leakage characteristics.

According to the first embodiment, the metal layer 211 contains the first metal element and the substance that is chemically reactive with the material gas containing the first metal element as described above. That is, the metal layer 211 is formed by silicon reduction of the silicon layer with the tungsten hexafluoride gas. Further, the reaction progresses from the surface side of the silicon layer. The delivery of the tungsten hexafluoride gas can thus be stopped at the timing when substantially all the silicon layer reacts. This reduces an influence of fluorine contained in the material gas, allowing for reducing degradation of leakage characteristics of the insulation layers.

Figure 10:
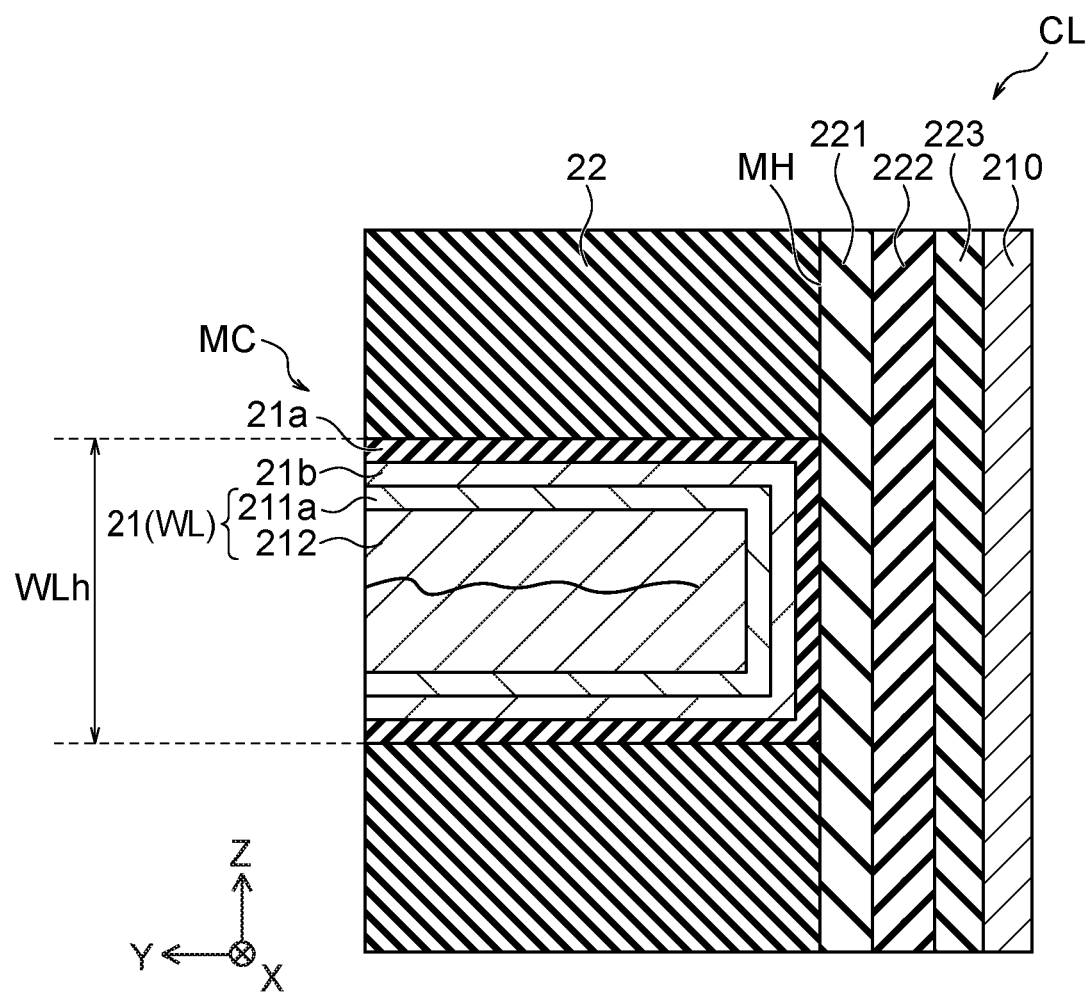
FIG. 10 is a cross sectional view showing a configuration of a semiconductor device according to Comparative Example.

FIG. 10 is a cross sectional view showing a configuration of a semiconductor device according to Comparative Example.

A barrier film 21b is usually provided between the block insulation film 21a and the conductive layer 21 as shown in FIG. 10. In a case where the conductive layer 21 is, for example, tungsten, for example, a stacked structure film of titanium nitride (TiN) and titanium (Ti) is selected as the barrier film 21b. The barrier film 21b is provided for the purpose of, for example, reducing degradation of reliability such as leakage characteristics. A manufacturing method of a metal layer 211a according to Comparative Example is different from that of the metal layer 211 in the first embodiment. The metal layer 211a is formed by, for example, repeating delivery of the tungsten hexafluoride gas and delivery of a Diborane ($B_2H_6$) gas. In this case, however, redundant tungsten hexafluoride is likely to enter the block insulation film 21a, the insulation layers 22, or the cover insulation film 221. Accordingly, it is necessary to protect the block insulation film 21a, the insulation layers 22, and the cover insulation film 221 by using the barrier film 21b.

In contrast, according to the first embodiment, the delivery of the tungsten hexafluoride gas can be stopped at the timing when substantially all the reactive layer 213 reacts by adjusting the gas delivery time. This allows less redundant tungsten hexafluoride to enter the block insulation film 21a, the insulation layers 22, or the cover insulation film 221. As a result, a fluorine concentration in the block insulation film 21a and the insulation layers 22 can be reduced by one order of magnitude, approximately, as compared with Comparative Example shown in FIG. 10. That is, diffusion of fluorine can be reduced without the necessity of using the barrier film 21b to reduce degradation of reliability such as leakage characteristics.

Therefore, according to the first embodiment, it is possible to eliminate the necessity of providing a metal layer (the barrier film 21b) containing a second metal element different from the first metal element between the conductive layer 21 and the insulation layers 22 as shown in FIG. 3. The second metal element is, for example, titanium (Ti).

A height WLh of the word line WL shown in FIG. 3 and FIG. 10 tends to decrease with miniaturization. A wiring resistance of the word line WL increases with a decrease in the height WLh. A possible method for reducing the wiring resistance is increasing a height (volume) of the metal layer 212, which is relatively low in resistance. In an example shown in FIG. 3, the barrier film 21b is omitted. This is because the barrier film 21b usually has a higher electrical resistance than the conductive layer 21 (the metal layer 212). As a result, the wiring resistance of the word line WL can be reduced by increasing the height of the metal layer 212 within the limited height WLh.

It should be noted that the barrier film 21b may be provided in the first embodiment. Even in this case, the barrier film 21b can be thinned as compared with in Comparative Example shown in FIG. 10 to reduce the wiring resistance of the word line WL.

Second Embodiment

Figure 11:
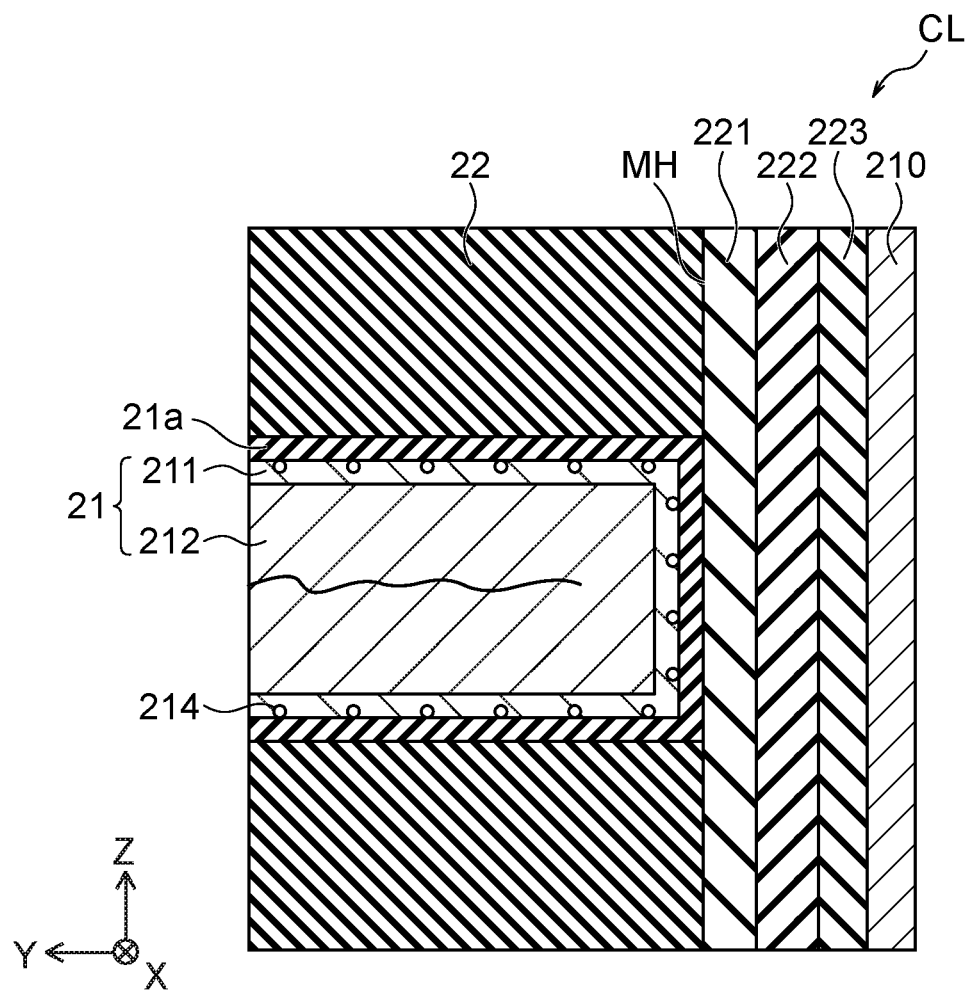
FIG. 11 is a cross sectional view showing a configuration of a semiconductor device according to a second embodiment.

FIG. 11 is a cross sectional view showing a configuration of a semiconductor device according to a second embodiment. The second embodiment is different from the first embodiment in that nitrogen is contained in the metal layer 211.

The metal layer 211 further contains nitrogen (N). In more detail, the metal layer 211 contains ammonia ($NH_3$) 214. For example, the metal layer 211 includes a nitrided layer with a high nitrogen concentration formed near an interface with the block insulation film 21a. Nitrogen in the metal layer 211 allows for improving adhesiveness between the block insulation film 21a and the metal layer 211 (the conductive layer 21). This is supposed to be because, for example, nitrogen in the metal layer 211 is chemically bonded to tungsten (W—N) and silicon (Si—N) in the metal layer 211 and aluminum (Al—N) in the block insulation film 21a.

Figure 12:
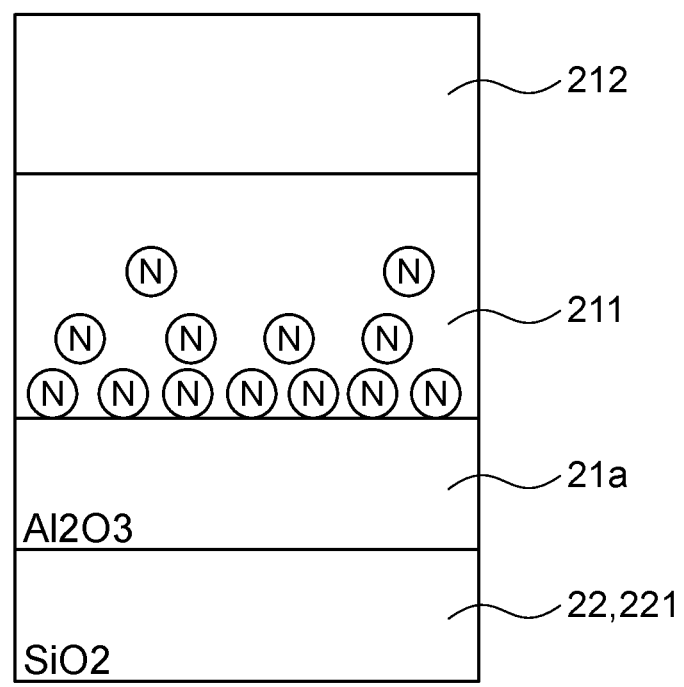
FIG. 12 schematically shows nitrogen within a metal layer in FIG. 11.

FIG. 12 schematically shows a nitrogen concentration in the metal layer 211 in FIG. 11.

Within the metal layer 211, a nitrogen concentration on a side near the insulation layer 22 is higher than a nitrogen concentration on a side near the metal layer 212 as shown in FIG. 12. The metal layer 211 has a highest concentration of the ammonia 214 near the interface with the block insulation film 21a. Further, in more detail, the nitrogen concentration of the metal layer 211 decreases from the side near the insulation layer 22 toward the side near the metal layer 212. This is because a part of the ammonia 214 diffuses from a side near the block insulation film 21a toward the side near the metal layer 212.

Figure 13:
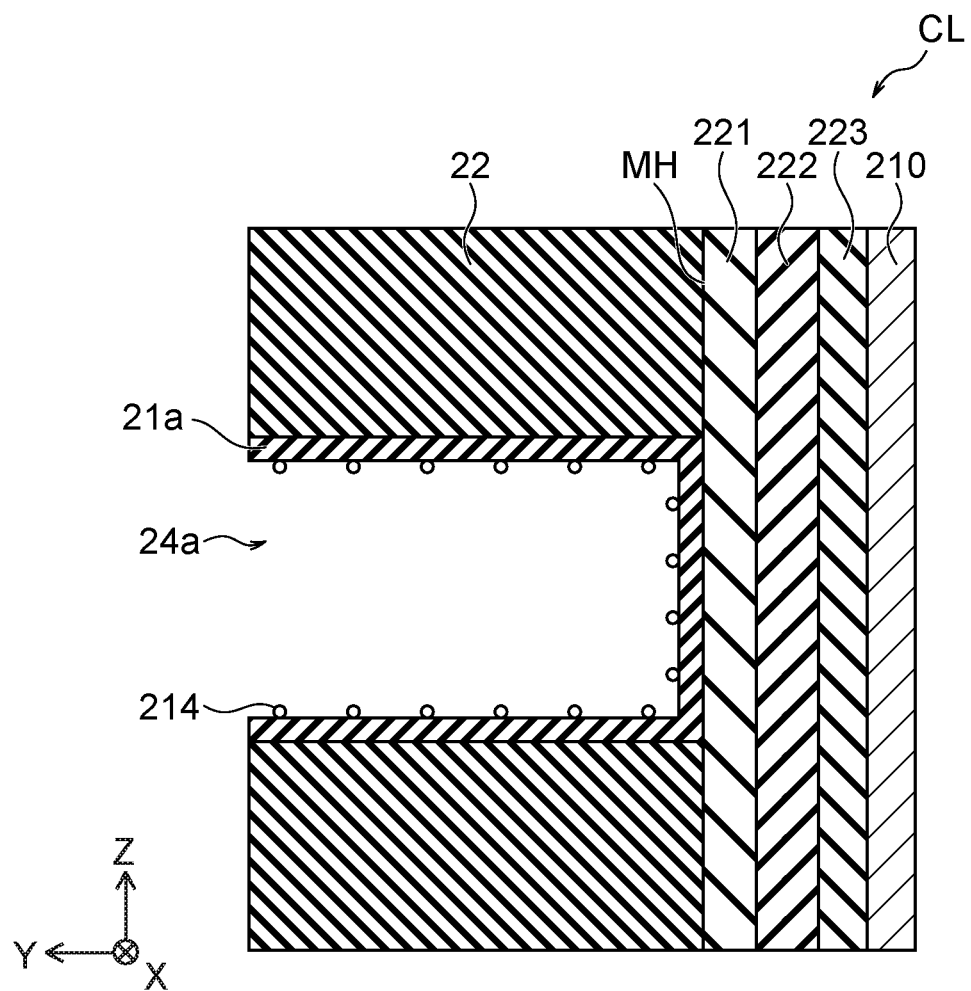
FIG. 13 is a cross sectional view showing a method of manufacturing the semiconductor device according to the second embodiment.

FIG. 13 is a cross sectional view showing a method of manufacturing the semiconductor device according to the second embodiment.

After the block insulation film 21a is formed (see FIG. 6), a nitrogen-containing gas is delivered to each of the regions from which the sacrificial layers 24 are removed as shown in FIG. 13. The nitrogen-containing gas is, for example, an ammonia (NH$_3$) gas. A delivery time of the ammonia gas is, for example, in a range from 10 seconds, approximately, to 60 seconds, approximately. The ammonia 214 is thus adsorbed onto the block insulation film 21a. A subsequent process is as in FIG. 7.

Here, the barrier film 21b shown in FIG. 10 regarding Comparative Example may be used not only for reliability as described in the first embodiment but also for, for example, improvement in adhesiveness between the conductive layer 21 and the block insulation film 21a.

In contrast, in the second embodiment, nitrogen (the ammonia 214) contained in the metal layer 211 allows for improving adhesiveness between the conductive layer 21 and the block insulation film 21a. That is, adhesiveness between the conductive layer 21 and the block insulation film 21a can be improved without the necessity of using the barrier film 21b.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising a stacked body comprising a plurality of conductive layers and a plurality of first insulation layers alternately stacked in a first direction, wherein
the conductive layers each comprise:
a first metal layer comprising a first metal element and a substance that is chemically reactive with a material gas comprising the first metal element; and
a second metal layer comprising the first metal element and having a lower content of the substance than the first metal layer,
the first metal layer is disposed between the first insulation layers and the second metal layer,
the first metal layer further comprises nitrogen (N), and
within the first metal layer, a nitrogen concentration of the first metal layer is higher on a side near each of the first insulation layers than on a side near the second metal layer.

2. The semiconductor device according to claim 1, wherein the nitrogen concentration of the first metal layer decreases from the side near each of the first insulation layers toward the side near the second metal layer.

3. A semiconductor device comprising a stacked body comprising a plurality of conductive layers and a plurality of first insulation layers alternately stacked in a first direction, wherein
the conductive layers each comprise:
a first metal layer comprising a first metal element and a substance that is chemically reactive with a material gas comprising the first metal element; and
a second metal layer comprising the first metal element and having a lower content of the substance than the first metal layer,
the first metal layer is disposed between the first insulation layers and the second metal layer,
no third metal layer comprising a second metal element different from the first metal element is provided between each of the conductive layers and the first insulation layers, and
the first metal layer further comprises nitrogen (N).

4. The semiconductor device according to claim 3, wherein within the first metal layer, a nitrogen concentration of the first metal layer is higher on a side near each of the first insulation layers than on a side near the second metal layer.

5. The semiconductor device according to claim 4, wherein the nitrogen concentration of the first metal layer decreases from the side near each of the first insulation layers toward the side near the second metal layer.

6. A method of manufacturing a semiconductor device, the method comprising:
removing, from a stacked body comprising a plurality of sacrificial layers and a plurality of first insulation layers alternately stacked in a first direction, the sacrificial layers;
forming a reactive layer at a part of each of regions from which the sacrificial layers are removed, the reactive layer comprising a substance that is chemically reactive with a material gas comprising a first metal element;
forming a first metal layer comprising the first metal element and the substance by delivering the material gas to each of the regions from which the sacrificial layers are removed and causing a chemical reaction of the reactive layer with the material gas; and
forming a second metal layer on the first metal layer such that each of the regions from which the sacrificial layers are removed is filled, the second metal layer comprising the first metal element and having a lower content of the substance than the first metal layer, wherein
the method further comprises, prior to the forming of the reactive layer, delivering a nitrogen-containing gas to each of the regions from which the sacrificial layers are removed.

7. The method of manufacturing a semiconductor device according to claim 6, wherein the forming of the first metal layer comprises delivering the material gas to each of the regions from which the sacrificial layers are removed for a duration of time corresponding to a thickness of the reactive layer and causing a chemical reaction of the reactive layer with the material gas.

8. The method of manufacturing a semiconductor device according to claim 6, further comprising, prior to the forming of the reactive layer, forming a second insulation layer at a part of each of the regions from which the sacrificial layers are removed.

9. The method of manufacturing a semiconductor device according to claim 7, further comprising, prior to the forming of the reactive layer, forming a second insulation layer at a part of each of the regions from which the sacrificial layers are removed.

10. The method of manufacturing a semiconductor device according to claim 6, wherein the nitrogen-containing gas is an ammonia ($NH_3$) gas.

11. The method of manufacturing a semiconductor device according to claim 8, wherein the nitrogen-containing gas is an ammonia ($NH_3$) gas.

* * * * *